(12) United States Patent
Sun et al.

(10) Patent No.: US 11,322,663 B2
(45) Date of Patent: May 3, 2022

(54) LIGHTING DEVICE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Fang-Jung Sun, New Taipei (TW); Shih-Chang Hsu, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/991,226

(22) Filed: Aug. 12, 2020

(65) Prior Publication Data

US 2021/0050491 A1 Feb. 18, 2021

Related U.S. Application Data

(60) Provisional application No. 62/885,872, filed on Aug. 13, 2019.

(30) Foreign Application Priority Data

Apr. 30, 2020 (CN) .......................... 202010364269.3

(51) Int. Cl.
*H01L 33/50* (2010.01)
*H01L 33/48* (2010.01)
*H01L 33/52* (2010.01)

(52) U.S. Cl.
CPC .......... *H01L 33/504* (2013.01); *H01L 33/486* (2013.01); *H01L 33/52* (2013.01)

(58) Field of Classification Search
CPC ...... H01L 33/504; H01L 33/486; H01L 33/52
See application file for complete search history.

(56) References Cited

U.S. PATENT DOCUMENTS

| 2007/0262335 | A1 | 11/2007 | Kumei et al. |
| 2016/0056349 | A1* | 2/2016 | Cui ........................ H01L 33/641 257/98 |

FOREIGN PATENT DOCUMENTS

| CN | 102947957 A | 2/2013 |
| CN | 106328795 A | 1/2017 |

(Continued)

OTHER PUBLICATIONS

Kumar, G. A., et al. "Synthesis and Upconversion Spectroscopy of Yb Er Doped M2O2S (M=La, Gd, Y) Phosphors" Science of Advanced Materials, vol. 4, No. 5-6, May 2012, pp. 623-630 (Year: 2012).*

(Continued)

*Primary Examiner* — Mark W Tornow
(74) *Attorney, Agent, or Firm* — Li & Cai Intellectual Property (USA) Office (57) ABSTRACT

A lighting device is provided. The lighting device includes a carrier, a light-emitting diode chip, and a wavelength up-conversion structure. The light-emitting diode chip is disposed on the carrier and is configured to emit a first light, which has a peak wavelength between 800 nm and 1000 nm. The wavelength up-conversion structure is disposed on the light-emitting diode chip and is configured to convert part of the first light into a second light, which has a converted spectrum between 400 nm and 700 nm.

14 Claims, 9 Drawing Sheets

(56) References Cited

FOREIGN PATENT DOCUMENTS

CN 205911310 U * 1/2017
CN 205911310 U   1/2017

OTHER PUBLICATIONS

Trilok K. Pathak, Ashwini Kumar, L.J.B. Erasmus, Anurag Pandey, E. Coetsee, H.C. Swart, R.E. Kroon, "Highly efficient infrared to visible up-conversion emission tuning from red to white in Eu/Yb co-doped NaYF4 phosphor," Spectrochimica Acta Part A: Molecular and Biomolecular Spectroscopy, vol. 207 (Year: 2018).*

* cited by examiner

LIGHTING DEVICE

CROSS-REFERENCE TO RELATED PATENT APPLICATION

This application claims the benefit of priority to China Patent Application No. 202010364269.3, filed on Apr. 30, 2020 in People's Republic of China. The entire content of the above identified application is incorporated herein by reference.

This application also claims priority to the U.S. Provisional Patent Application Ser. No. 62/885,872, filed Aug. 13, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a lighting device, and more particularly to a lighting device using near-infrared light-emitting diode chip, which can be applied to detectors, monitors, cameras for license plate recognition, and so on.

BACKGROUND OF THE DISCLOSURE

With the increasing awareness of security in houses and offices, people install monitors for self-protection, and most of the monitors use infrared cameras. However, as an infrared light-emitting diode chip of a common monitor emits part of the red light, a red spot will be produced at the position of the infrared light-emitting diode chip.

In practice, such a red spot can cause many problems. For instance, the general vehicle license plate recognition system uses the red light as the recognition light source. As such, when the monitoring device projects a red spot, recognition interference is caused. In addition, for passers-by, the red spot of the monitor will be confused with the red light of the traffic light, and negatively effect on-road safety.

In order to prevent the red light emitted by such cameras from interfering with human eyes and other equipment, existing ways include encapsulating together the infrared light-emitting diode chip and a blue light-emitting diode chip, with the blue light-emitting diode chip being used with phosphor to simultaneously achieve the effect of producing white light illumination and preventing red light from being perceived. However, the above structural design is not conducive to miniaturization of products.

SUMMARY OF THE DISCLOSURE

In response to the above-referenced technical inadequacies, the present disclosure provides a lighting device.

In one aspect, the present disclosure provides a lighting device including a carrier, a light-emitting diode chip, and a wavelength up-conversion structure. The light-emitting diode chip is disposed on the carrier and is configured to emit a first light, which has a peak wavelength between 800 nm and 1000 nm. The wavelength up-conversion structure is disposed on the light-emitting diode chip and is configured to convert part of the first light into a second light, which has a converted spectrum between 400 nm and 700 nm.

In certain embodiments, the first light, before being converted by the wavelength up-conversion structure, has a first light intensity, and the first light that remains after the part of the first light is converted by the wavelength up-conversion structure has a second light intensity, and the second light intensity is greater than 50% of the first light intensity.

In certain embodiments, the wavelength up-conversion structure includes a base and a wavelength up-conversion material disposed in the base.

In certain embodiments, the lighting device further includes a light-transmissive layer, the light-transmissive layer encapsulates the light-emitting diode chip, and the wavelength up-conversion structure is formed on the light-transmissive layer.

In certain embodiments, the light-emitting diode chip has an upper light-emitting surface, and the wavelength up-conversion structure is covered upon the upper light-emitting surface, wherein the lighting device further includes a light-transmissive layer and the light-transmissive layer encapsulates the wavelength up-conversion structure and the light-emitting diode chip.

In certain embodiments, a light output surface of the wavelength up-conversion structure is a flat surface or a curved surface.

In certain embodiments, the wavelength up-conversion material is selected from a group consisting of phosphors represented by the following chemical structure formulas: $NaYF_3$:Yb, $LaNbO_4$:Yb, and $Gd_2O_2S$:Yb, Er.

In certain embodiments, the wavelength up-conversion material includes a green phosphor and a blue phosphor, the chemical structure formula of the green phosphor is $NaYF_3$: Yb or $LaNbO_4$:Yb, and the chemical structure formula of the blue phosphor is $NaYF_3$:Yb.

In certain embodiments, based on the total weight of the wavelength up-conversion structure being 100 wt %, the concentration of the green phosphor ranges from 2.5 wt % to 30 wt %, and the concentration of the blue phosphor ranges from 2.5 wt % to 30 wt %.

In certain embodiments, the wavelength up-conversion material includes a green phosphor and a blue phosphor, the chemical structure formulas of the green phosphor and the blue phosphor both being $Gd_2O_2S$:Yb, Er.

In certain embodiments, based on the total weight of the wavelength up-conversion structure being 100 wt %, the concentration of the green phosphor ranges from 2.5 wt % to 30 wt %, and the concentration of the blue phosphor ranges from 2.5 wt % to 30 wt %.

In certain embodiments, the first light, before being converted by the wavelength up-conversion structure, has a first chromaticity CIE coordinate, while the first light that remains after the part of the first light is converted by the wavelength up-conversion structure and the second light are mixed to form a third light, and the third light has a second chromaticity CIE coordinate, which is different from the first chromaticity CIE coordinate.

In certain embodiments, the second chromaticity CIE coordinate is located in a CIE X coordinate ranging from 0.28 to 0.35, and a CIE Y coordinate ranging from 0.21 to 0.65.

One of the advantages of the present disclosure is that, the lighting device can eliminate or reduce the interference effect of red light through the technical solution of "the light-emitting diode chip is configured to emit a first light which has a peak wavelength between 800 nm and 1000 nm, the wavelength up-conversion structure covers the light-emitting diode chip and is configured to convert part of the first light into a second light which has a converted spectrum between 400 nm and 700 nm".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
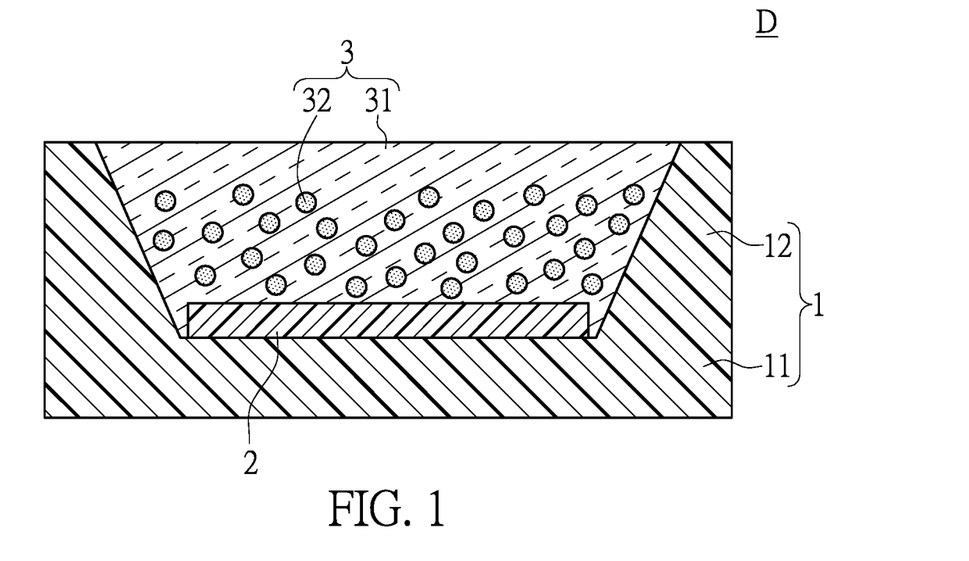
FIG. 1 is a schematic view of a lighting device of the present disclosure.
Figure 2:
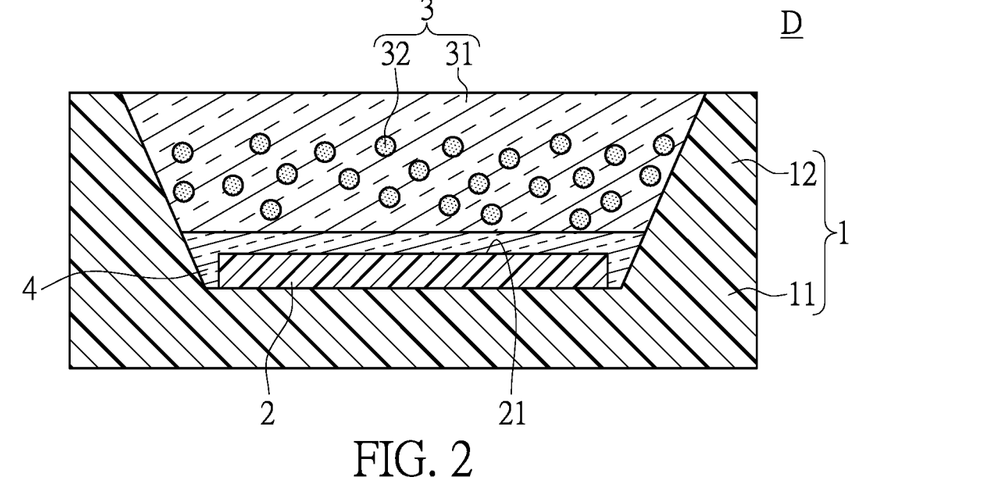
FIG. 2 is another schematic view of the lighting device of the present disclosure.
Figure 3:
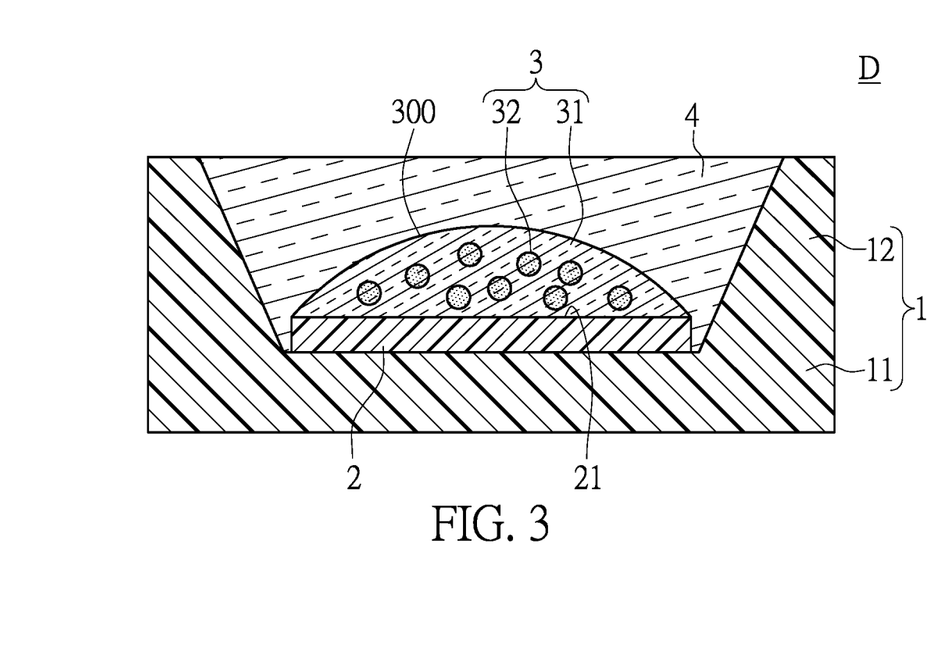
FIG. 3 is yet another schematic view of the lighting device of the present disclosure.

Referring to FIG. 1 to FIG. 3, the present disclosure provides a lighting device D, which includes a carrier 1, a light-emitting diode chip 2, and a wavelength up-conversion structure 3. The light-emitting diode chip 2 is disposed on the carrier 1 and the wavelength up-conversion structure 3 is disposed on the light-emitting diode chip 2. Although the wavelength up-conversion structure 3 is illustrated as covering the light-emitting diode chip 2 in FIGS. 1 to 3, the wavelength up-conversion structure 3 can be disposed on a light output path of the light-emitting diode chip 2 without being in direct contact with the light-emitting diode chip 2 according to actual needs.

In use, the light-emitting diode chip 2 can emit a first light, which has a peak wavelength between 800 nm and 1000 nm, the wavelength up-conversion structure 3 can convert part of the first light into a second light, which has a converted spectrum between 400 nm and 700 nm, and the first light that remains after the part of the first light is converted by the wavelength up-conversion structure is mixed with the second light to form a third light. The lighting device D of the present disclosure can be applied to detectors, monitors and cameras for license plate recognition, but it is not limited thereto.

In this embodiment, the first light emitted by the light-emitting diode chip 2 is a near-infrared light, and the second light converted by the wavelength up-conversion structure 3 is a blue light, a green light or a combination thereof, therefore, the lighting device D can emit blue-white or green-white light. It should be noted that the first light (that is, the initial first light) before being converted by the wavelength up-conversion structure 3 has a first light intensity, the first light that remains after the part of the first light is converted by the wavelength up-conversion structure has a second light intensity, and the second light intensity is greater than 50% of the first light intensity, so as to meet practical requirements.

Further, the initial first light has a first chromaticity CIE coordinate, the third light mixed by the first light that remains after the part of the first light is converted by the wavelength up-conversion structure and the second light has a second chromaticity CIE coordinate, which is different from the first chromaticity CIE coordinate, and the second chromaticity CIE coordinate has a CIE X coordinate ranging from 0.28 to 0.35, preferably from 0.29 to 0.33, and a CIE Y coordinate ranging from 0.21 to 0.65, preferably from 0.21 to 0.31.

Furthermore, referring to FIG. 1 to FIG. 3, the carrier 1 can include a base plate 11 and a side wall 12 disposed on the base plate 11, and the light-emitting diode chip 2 and the wavelength up-conversion structure 3 are located in an area surrounded by the side wall 12 so that the internal light transmitted in the wavelength up-conversion structure 3 can be reflected on the side wall 12 so as to be emitted outward. In practice, electrically conductive structures (such as conductive pads and vias) can be formed on the base plate 11 to serve as the connection interface and signal transmission path of the light-emitting diode chip 2, a reflective layer can be formed on the side wall 12 to improve the light extraction efficiency, and the side wall 12 and the base plate 11 can be an integrally formed structure, or the side wall 12 can be bonded to the base plate 11 through an adhesive layer (not shown in figures). However, the above mentioned is only a feasible implementation manner of the carrier 1 and is not intended to limit the present disclosure. In certain embodiments, the carrier 1 may not include a side wall, but is only in the form of a base plate.

The light-emitting diode chip 2 can be a horizontal or vertical chip and be mounted on the base plate 11 by flip chip or wire bonding. In practice, the light-emitting diode chip 2 can use near-infrared light-emitting diode chip with a wavelength between 800 nm and 900 nm, that is, the first light has a peak wavelength between 800 nm and 900 nm, and preferably 850 nm; alternatively, the light-emitting diode chip 2 can use near-infrared light-emitting diode chips with a peak wavelength between 900 nm and 1000 nm, that is, the first light has a peak wavelength between 800 nm and 900 nm, and preferably 940 nm.

Referring to FIG. 1, the wavelength up-conversion structure 3 includes a base 31 and a wavelength up-conversion material 32, and the wavelength up-conversion material 32 is disposed in the base 31, preferably uniformly distributed in the base 31. In this embodiment, as shown in FIGS. 2 and 3, the wavelength up-conversion structure 3 can have different structures.

Further, as shown in FIG. 2, the lighting device D of the present disclosure can further include a light-transmissive layer 4 that covers the light-emitting diode chip 2 and the wavelength up-conversion structure 3 is formed on the light-transmissive layer 4 so that the wavelength up-conversion material 32 and the upper light-emitting surface 21 of the light-emitting diode chip 2 can maintain a predetermined distance. In addition, as shown in FIG. 3, the wavelength up-conversion structure 3 can cover the upper light-emitting surface 21 of the light-emitting diode chip 2, and the light-transmissive layer 4 encapsulates the wavelength up-conversion structure 3 and the light-emitting diode chip 2. Considering the light output efficiency, a light output surface 300 of the wavelength up-conversion structure 3 can be a flat surface or a curved surface, preferably a curved surface.

The wavelength up-conversion material 32 has the characteristic of up-conversion, which can convert infrared light into visible light; in other words, the wavelength up-conversion material 32 absorbs relatively low energy light (such as infrared light), and emits a relatively high energy light (such as blue or green light). Furthermore, the wavelength up-conversion material 32 is selected from a group consisting of phosphors represented by the following chemical structure formulas: 1. $Gd_2O_2S:Yb, Er$, 2. $LaNbO_4:Yb$, and 3. $NaYF_3:Yb$. In the chemical structure formula 1, Gd represents as gadolinium, O represents as oxygen, S represents as sulfur, Yb and Er are activators, Yb represents as ytterbium, and Er represents as erbium. In the chemical structure formula 2, La represents as lanthanum, Nb represents as niobium, O represents as oxygen, and Yb is an activator and represents as ytterbium. In the chemical structure formula 3, Na represents as sodium, Y represents as yttrium, F represents as fluorine, and Yb is an activator and represents as ytterbium. In practice, the phosphor represented by chemical structure formula 1 can be used as green or blue phosphor, the phosphor represented by chemical structure formula 2 can be used as green phosphor, and the phosphor represented by chemical structure 3 can be used as green or blue phosphor.

In certain embodiments, the lighting device of the present disclosure can use the wavelength up-conversion structure 3 as shown in FIG. 2, and the wavelength up-conversion material 32 includes a green phosphor whose chemical structure is $NaYF_3:Yb$ or $LaNbO_4:Yb$, and a blue phosphor whose chemical structure is $NaYF_3:Yb$. Further, based on the total weight of the wavelength up-conversion structure 3 being 100 wt %, the concentration of the green phosphor ranges from 2.5 wt % to 30 wt %, and the concentration of the blue phosphor ranges from 2.5 wt % to 30 wt %. In certain embodiments, the lighting device of the present disclosure can use the wavelength up-conversion structure 3 as shown in FIG. 3, and the wavelength up-conversion material 32 includes a green phosphor and a blue phosphor whose chemical structure formula are all $Gd_2O_2S:Yb, Er$, and based on the total weight of the wavelength up-conversion structure 3 being 100 wt %, the concentration of the green phosphor ranges from 2.5 wt % to 30 wt %, and the concentration of the blue phosphor ranges from 2.5 wt % to 30 wt %.

The actual test results will be described below to verify the luminous effect expected by the present disclosure.

Figure 4:
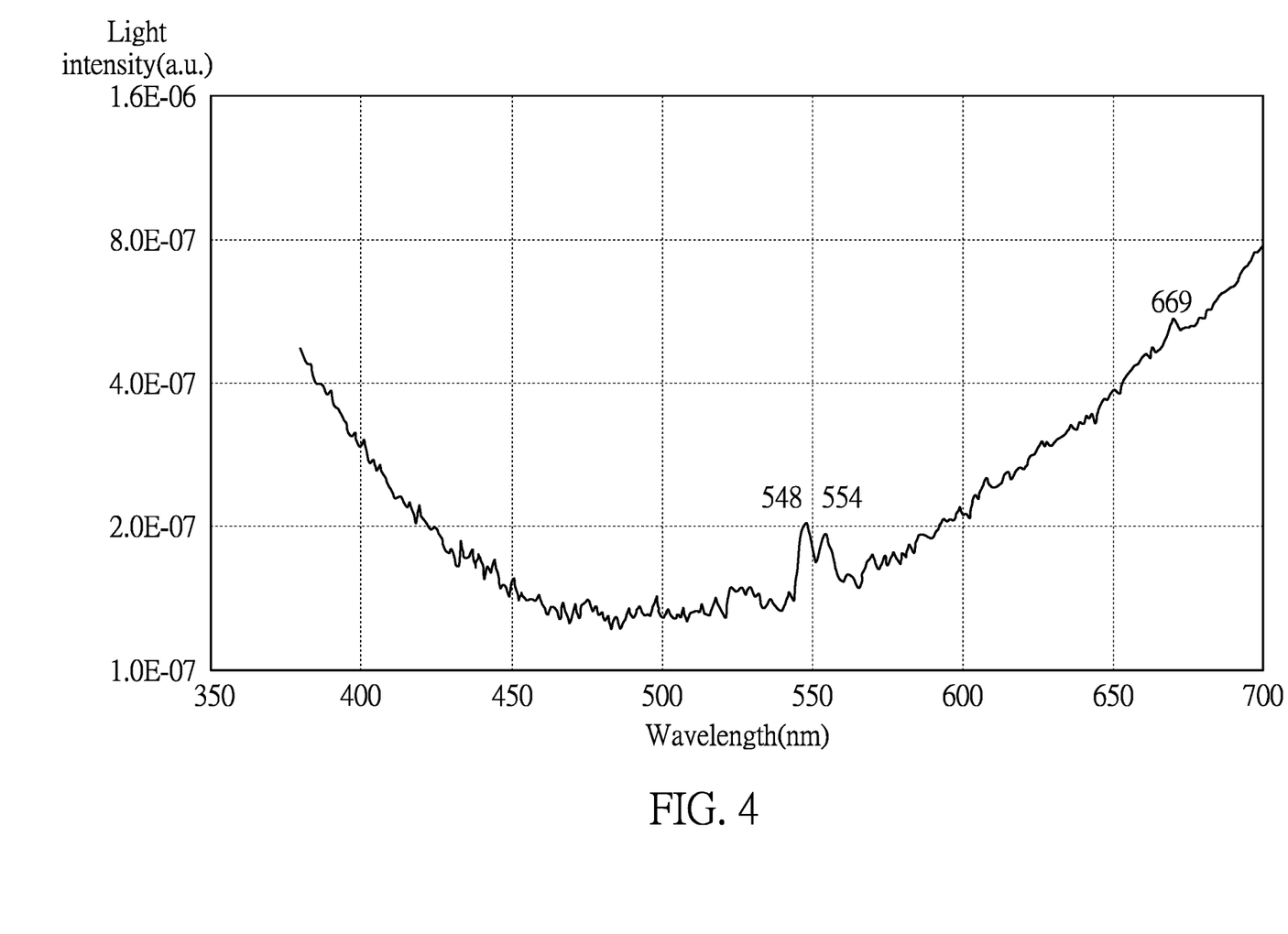
FIG. 4 shows a converted spectrum of a green phosphor represented by chemical structure formula 1 generated by a light with a peak wavelength of 850 nm.
Figure 5:
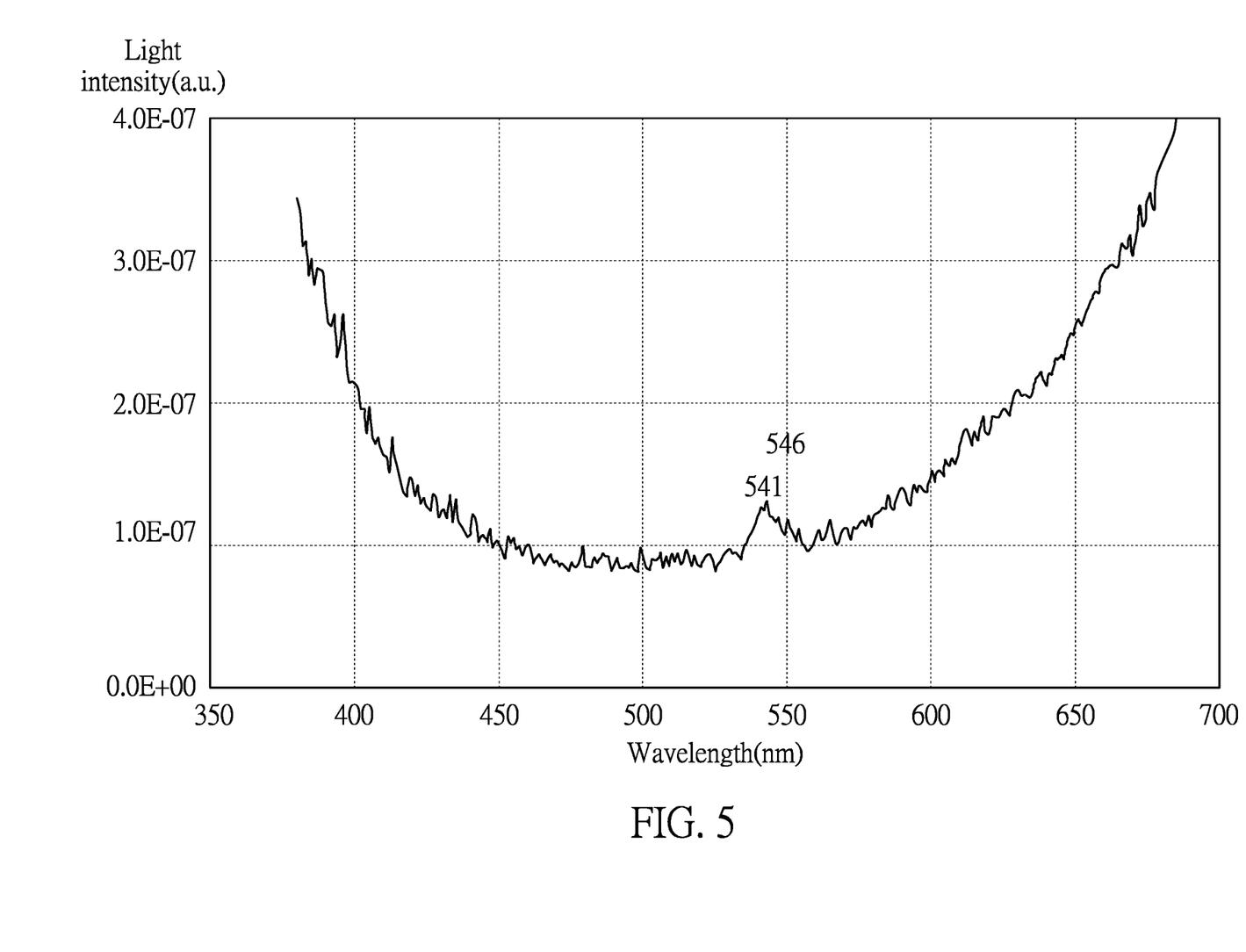
FIG. 5 shows a converted spectrum of a green phosphor represented by a chemical structure formula 2 generated by a light with a peak wavelength of 850 nm.

In a test using a near-infrared light-emitting diode chip with a peak wavelength of 850 nm and a green phosphor represented by the chemical structure formula 1 at a concentration of 20%, the second light obtained by converting part of the first light through the wavelength up-conversion structure 3 has a converted spectrum as shown in FIG. 4, so that the lighting device D can emit yellowish green light. In a test using a near-infrared light-emitting diode chip with a light-emitting wavelength of 850 nm and a green phosphor represented by the chemical structure formula 2 at a concentration of 20%, the second light obtained by converting part of the first light through the wavelength up-conversion structure 3 has a converted spectrum as shown in FIG. 5, so that the lighting device D also can emit yellowish green light.

Figure 6:
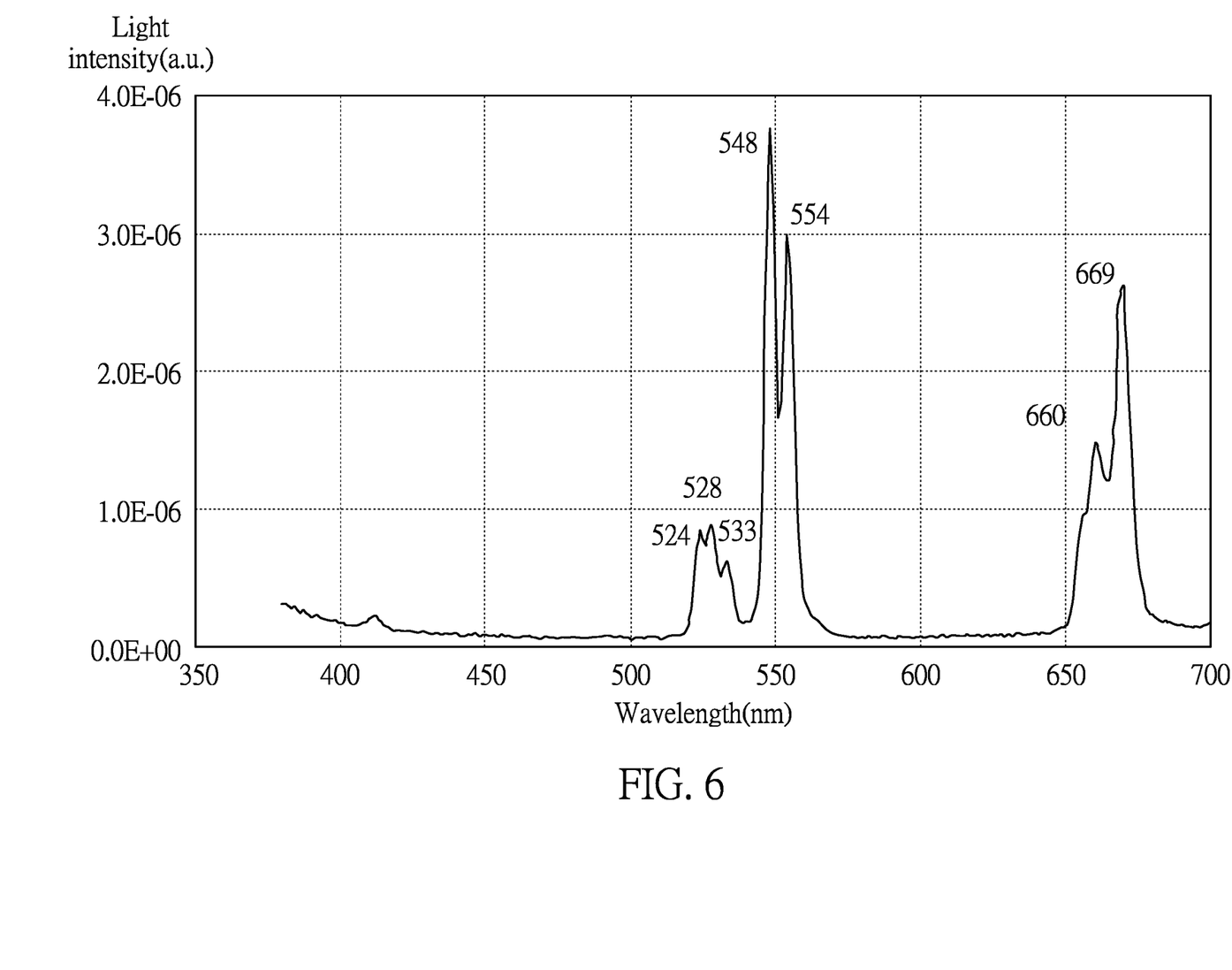
FIG. 6 shows a converted spectrum of the green phosphor represented by the chemical structure formula 1 generated by a light with a peak wavelength of 940 nm.
Figure 7:
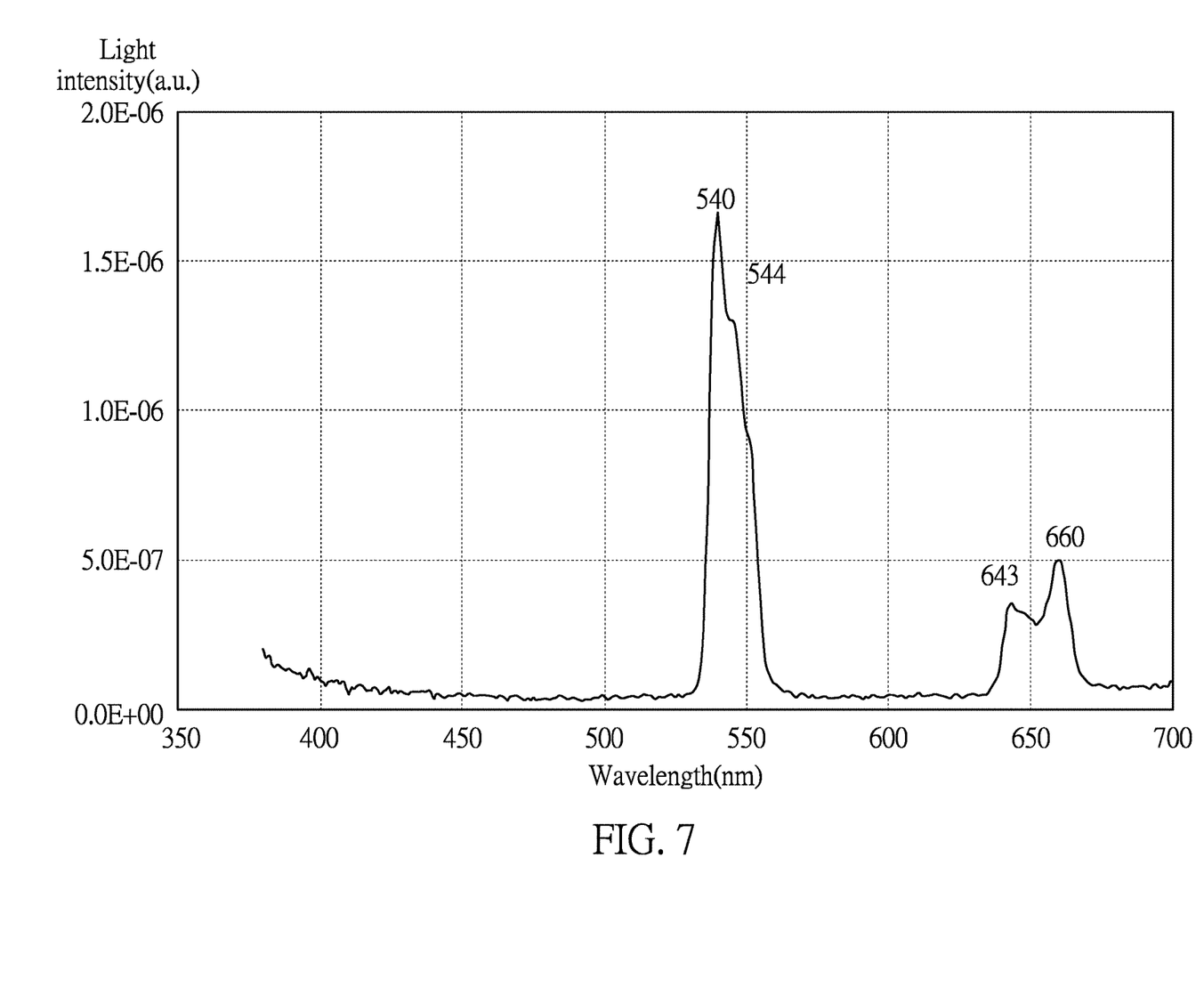
FIG. 7 shows a converted spectrum of the green phosphor represented by the chemical structure formula 2 generated by a light with a peak wavelength of 940 nm.

Moreover, in a test using a near-infrared light-emitting diode chip with a peak wavelength of 940 nm and a green phosphor represent by the chemical structure formula 1 at a concentration of 20%, the second light obtained by converting part of the first light through the wavelength up-conversion structure 3 has a converted spectrum as shown in FIG. 6, so that, the lighting device D can emit green light. In a test using a near-infrared light-emitting diode chip with a peak wavelength of 940 nm and a green phosphor represented by the chemical structure formula 2 at a concentration of 20%, the second light obtained by converting part of the first light through the wavelength up-conversion structure 3 has a converted spectrum as shown in FIG. 7, so that the lighting device D also can emit green light.

Referring to Table 1, Table 1 shows the luminous effect produced by the near-infrared light-emitting diode chip with a peak wavelength of 940 nm and different phosphor or phosphor mixtures.

The phosphors used include the green phosphor represented by the chemical structure formula 1 (hereinafter referred to as "green phosphor B"), the blue phosphor represented by the chemical structure formula 1 (hereinafter referred to as "blue phosphor B"), the green phosphor represented by the chemical structure formula 3 (hereinafter referred to as "green phosphor A") and the blue phosphor represented by the chemical structure formula 3 (hereinafter referred to as "blue phosphor A").

TABLE 1

| Phosphor or phosphor mixtures | Luminous effect | Phosphor or phosphor mixtures | Luminous effect |
|---|---|---|---|
| Blue phosphor A 2.5% | Blue light | Blue phosphor B 2.5% | Blue light |
| Blue phosphor A 10% | Blue light | Blue phosphor B 10% | Blue light |
| Blue phosphor A 20% | Blue light | Blue phosphor B 20% | Blue light |
| Blue phosphor A 30% | Blue light | Blue phosphor B 30% | Blue light |
| Green phosphor A 2.5% | Green light | Green phosphor B 2.5% | Green light |
| Green phosphor A 10% | Green light | Green phosphor B 10% | Green light |
| Green phosphor A 20% | Green light | Green phosphor B 20% | Green light |
| Blue phosphor A 10% + Green phosphor A 2.5% | White light with bluish green | Blue phosphor B 10% + Green phosphor B 2.5% | White light with bluish green |
| Blue phosphor A 6.25% + Green phosphor A 6.25% | White light with bluish green | Blue phosphor B 6.25% + Green phosphor B 6.25% | Green light |
| Blue phosphor A 2.5% + Green phosphor A 10% | Green light | Blue phosphor B 2.5% + Green phosphor B 10% | Green light |

As shown in Table 1, in the presence of a specific phosphor or phosphor mixtures, a part of infrared light with a peak wavelength range between 900 nm and 1000 nm can be converted into visible light.

Figure 8:
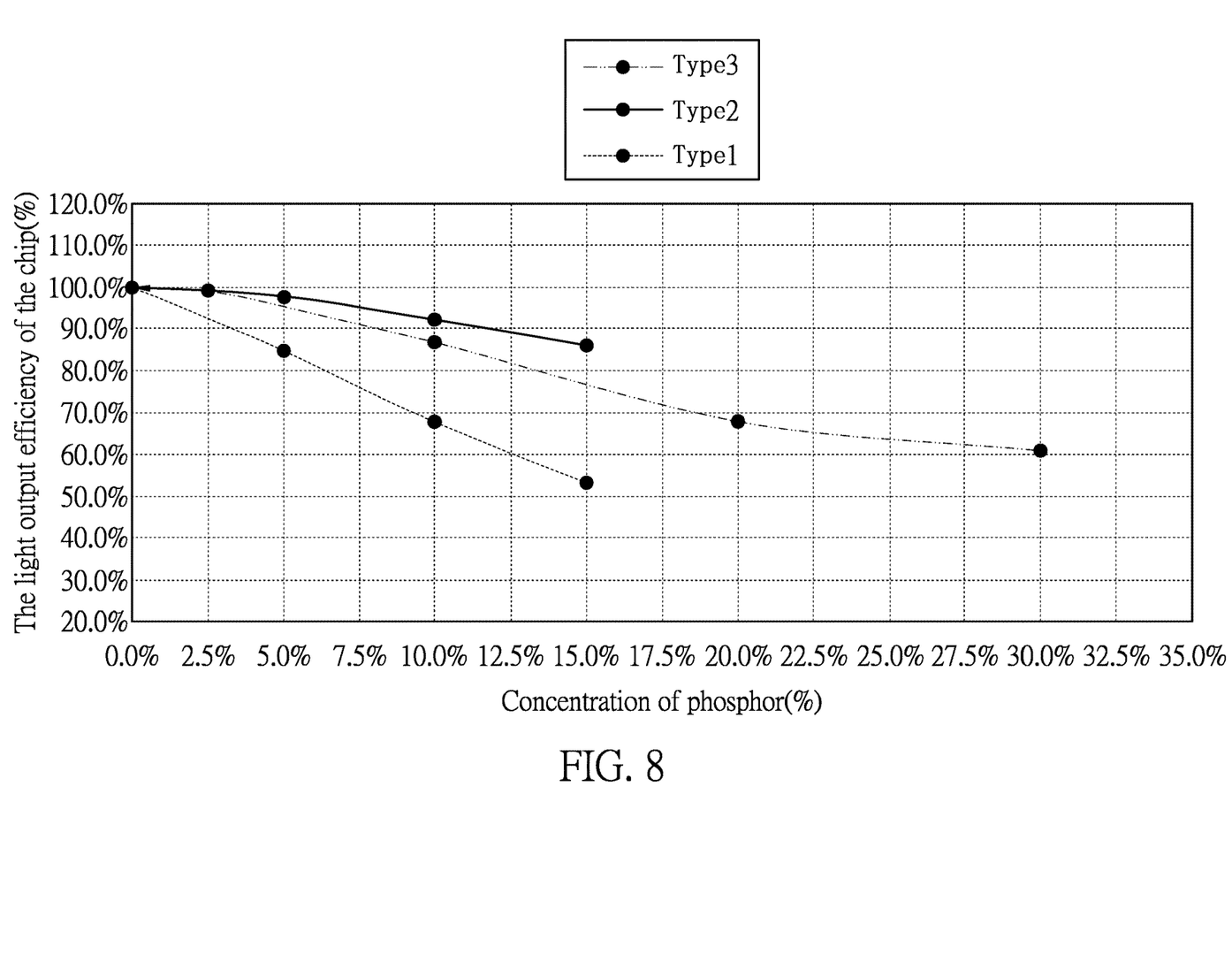
FIG. 8 shows light output efficiencies of the light-emitting diode chip with a peak wavelength of 850 nm, which are generated by in the presence of different concentrations of wavelength conversion materials according to different wavelength conversion structures.
Figure 9:
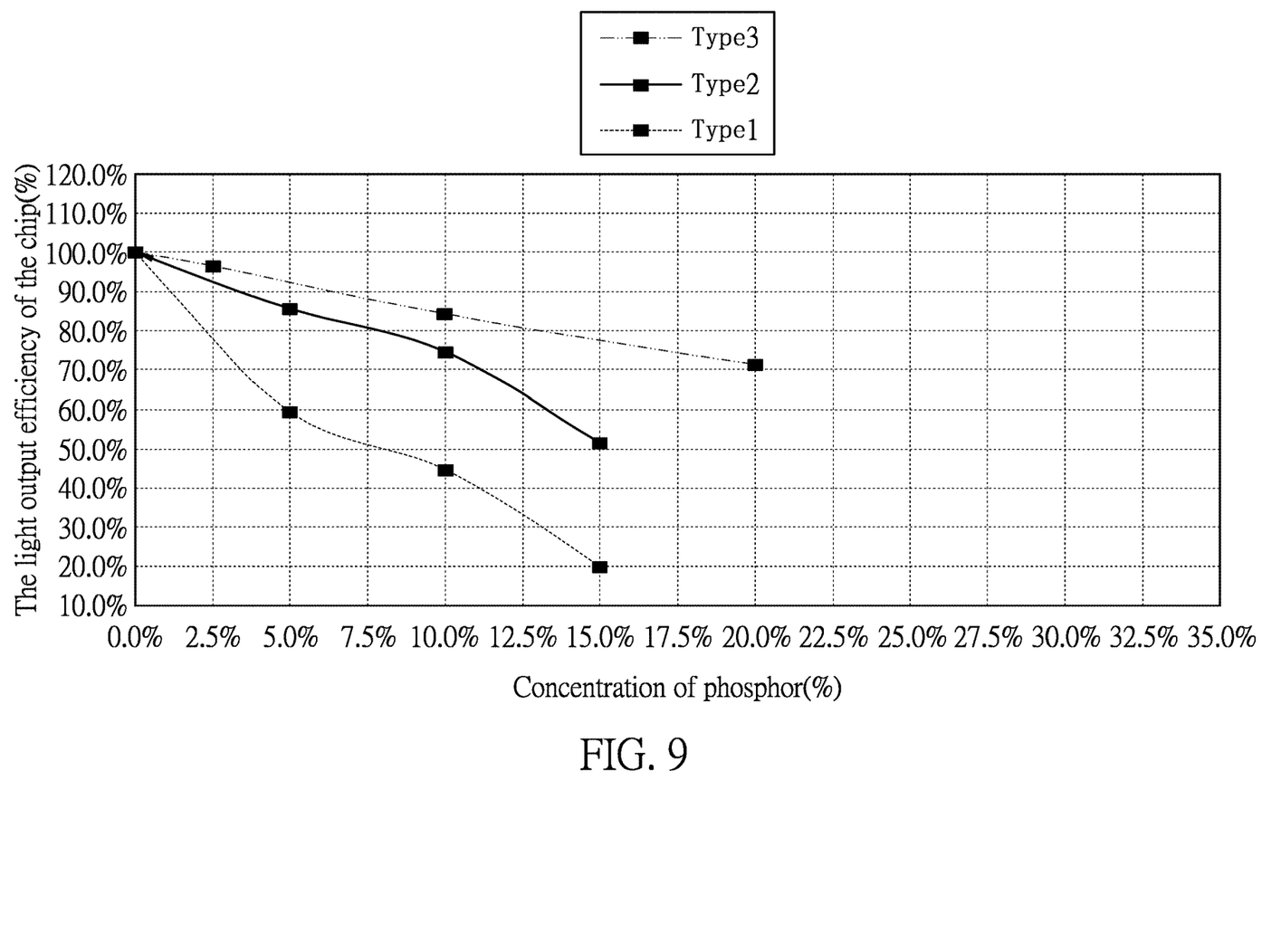
FIG. 9 shows light output efficiencies of the light-emitting diode chip with a peak wavelength of 940 nm, which are generated by in the presence of different concentrations of wavelength conversion materials according to different wavelength conversion structures.

Referring to FIG. 8 and FIG. 9, which is to be read in conjunction with FIG. 1 to FIG. 3, FIG. 8 and FIG. 9 respectively show a light output efficiency of the light-emitting diode chips 2 with a peak wavelength of 850 nm and 940 nm, according to different wavelength up-conversion structures 3, and in the presence of different concentrations of green phosphor B (that is, the wavelength up-conversion material 32). In FIG. 8 and FIG. 9, the wavelength up-conversion structure 3 of type 1 is shown in FIG. 1; the wavelength up-conversion structure 3 of type 2 is shown in FIG. 2, and the wavelength up-conversion structure 3 of type 3 is shown in FIG. 3. As can be observed from FIG. 8 and FIG. 9, in the presence of an effective concentration of phosphor, a light output efficiency of the light-emitting diode chip 2 with a peak wavelength between 800 nm and 1000 nm can still be maintained above 50%. The term "effective concentration" as used herein refers to a concentration that can partially convert infrared light in the aforementioned wavelength range into visible light.

Figure 10:
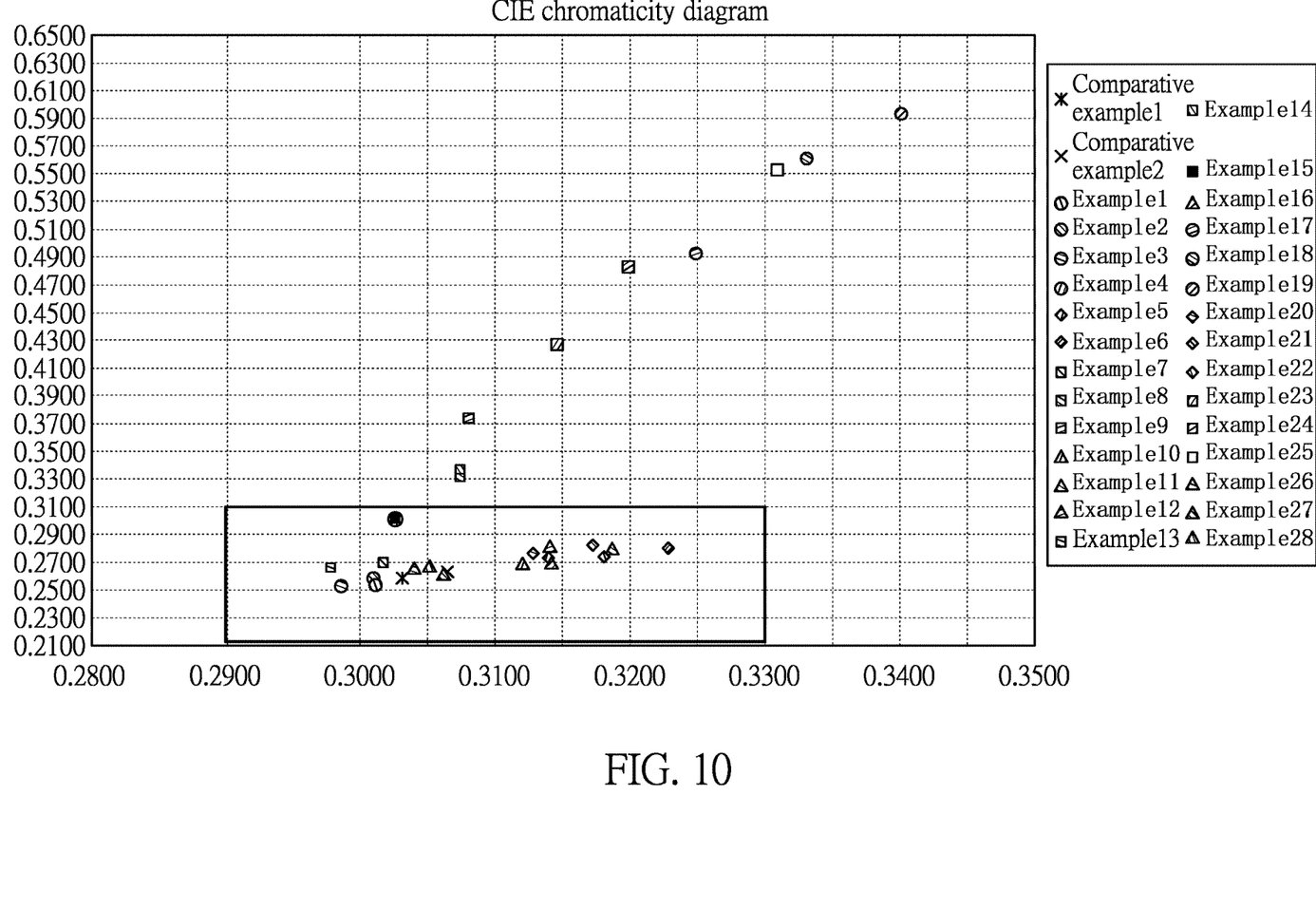
FIG. 10 shows the chromaticity coordinates generated by variety of combinations of light-emitting diode chips with different light-emitting wavelengths coordinating and different phosphor or phosphor mixtures.

Referring to FIG. 10 and Table 2, FIG. 10 is a CIE chromaticity diagram showing the chromaticity coordinates generated by light-emitting diode chips with different light-emitting wavelengths and different phosphor or phosphor mixtures, and Table 2 shows the characteristics of each example in FIG. 10. As can be observed from FIG. 10 and Table 2, by using a specific type of wavelength up-conversion structure, which is formed using a specific phosphor or phosphor mixtures, a part of infrared light with a peak wavelength range between 800 nm and 1000 nm can be converted into visible light that falls within a chromaticity area that meets needs of actual application. The CIE X coordinate of the CIE coordinates of the chromaticity area is between 0.28 and 0.35, and the CIE Y coordinate is between 0.21 and 0.65. Preferably, the CIE X coordinate is between 0.29 and 0.33, and the CIE Y coordinate is between 0.21 and 0.31, so that the color range in the chromaticity area is less likely to attract attention because it is close to white light.

TABLE 2

| | The light-emitting wavelength of the chip | Phosphor or phosphor mixtures | The wavelength up-conversion structure |
|---|---|---|---|
| Comparative example 1 | 940 nm | None | — |
| Comparative example 2 | 850 nm | None | — |
| Example 1 | 940 nm | Blue phosphor B 2.5% | Type 3 |
| Example 2 | 940 nm | Blue phosphor B 10% | Type 3 |
| Example 3 | 940 nm | Blue phosphor B 20% | Type 3 |
| Example 4 | 940 nm | Blue phosphor B 30% | Type 3 |
| Example 5 | 850 nm | Blue phosphor B 10% | Type 3 |
| Example 6 | 850 nm | Blue phosphor B 20% | Type 3 |
| Example 7 | 940 nm | Green phosphor B 2.5% | Type 3 |
| Example 8 | 940 nm | Green phosphor B 10% | Type 3 |
| Example 9 | 940 nm | Green phosphor B 20% | Type 3 |
| Example 10 | 850 nm | Green phosphor B 2.5% | Type 3 |
| Example 11 | 850 nm | Green phosphor B 20% | Type 3 |
| Example 12 | 850 nm | Green phosphor B 30% | Type 3 |
| Example 13 | 940 nm | Blue phosphor B 10% + Green phosphor B 2.5% | Type 3 |
| Example 14 | 940 nm | Blue phosphor B 2.5% + Green phosphor B 10% | Type 3 |
| Example 15 | 940 nm | Blue phosphor B 6.25% + Green phosphor B 6.25% | Type 3 |
| Example 16 | 850 nm | Blue phosphor B 10% + Green phosphor B 2.5% | Type 3 |
| Example 17 | 940 nm | Green phosphor B 5% | Type 1 |
| Example 18 | 940 nm | Green phosphor B 10% | Type 1 |
| Example 19 | 940 nm | Green phosphor B 15% | Type 1 |

TABLE 2-continued

|  | The light-emitting wavelength of the chip | Phosphor or phosphor mixtures | The wavelength up-conversion structure |
|---|---|---|---|
| Example 20 | 850 nm | Green phosphor B 5% | Type 1 |
| Example 21 | 850 nm | Green phosphor B 10% | Type 1 |
| Example 22 | 850 nm | Green phosphor B 15% | Type 1 |
| Example 23 | 940 nm | Green phosphor B 5% | Type 2 |
| Example 24 | 940 nm | Green phosphor B 10% | Type 2 |
| Example 25 | 940 nm | Green phosphor B 15% | Type 2 |
| Example 26 | 850 nm | Green phosphor B 5% | Type 2 |
| Example 27 | 850 nm | Green phosphor B 10% | Type 2 |
| Example 28 | 850 nm | Green phosphor B 15% | Type 2 |

One of the advantages of the present disclosure is that, through the technical solution of "the light-emitting diode chip is configured to emit a first light which has a peak wavelength between 800 nm and 1000 nm, the wavelength up-conversion structure covers the light-emitting diode chip and is configured to convert part of the first light into a second light which has a converted spectrum between 400 nm and 700 nm", the lighting device can convert a part of infrared light into visible light, especially blue-white or green-white light, so as to avoid the problem of red light interference in practical application. For instance, it can prevent the human eye from being dazzled by the red light at night, and prevent the human eye from mistakenly identifying the red light used to identify license plates as the red light of the traffic light.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A lighting device, comprising:
   a carrier;
   a light-emitting diode chip being disposed on the carrier and configured to emit a first light which has a peak wavelength between 800 nm and 1000 nm; and
   a wavelength up-conversion structure being disposed on the light-emitting diode chip and configured to convert part of the first light into a second light which has a converted spectrum between 400 nm and 700 nm;
   wherein the first light, before being converted by the wavelength up-conversion structure, has a first light intensity, and the first light that remains after the part of the first light is converted by the wavelength up-conversion structure has a second light intensity, and the second light intensity is greater than 50% of the first light intensity.

2. The lighting device according to claim 1, wherein the wavelength up-conversion structure includes a base and a wavelength up-conversion material disposed in the base.

3. The lighting device according to claim 2, wherein the wavelength up-conversion material is uniformly distributed in the base.

4. The lighting device according to claim 2, wherein the lighting device further comprises a light-transmissive layer, the light-transmissive layer encapsulates the light-emitting diode chip, and the wavelength up-conversion structure is formed on the light-transmissive layer.

5. The lighting device according to claim 4, wherein the wavelength up-conversion material is selected from a group consisting of phosphors represented by the following chemical structure formulas: $NaYF_3$:Yb, $LaNbO_4$:Yb, and $Gd_2O_2S$:Yb, Er.

6. The lighting device according to claim 2, wherein the light-emitting diode chip has an upper light-emitting surface, and the wavelength up-conversion structure is covered upon the upper light-emitting surface, wherein the lighting device further comprises a light-transmissive layer, and the light-transmissive layer encapsulates the wavelength up-conversion structure and the light-emitting diode chip.

7. The lighting device according to claim 6, wherein a light output surface of the wavelength up-conversion structure is a flat surface or a curved surface.

8. The lighting device according to claim 6, wherein the wavelength up-conversion material is selected from a group consisting of phosphors represented by the following chemical structure formulas: $NaYF_3$:Yb, $LaNbO_4$:Yb, and $Gd_2O_2S$:Yb, Er.

9. The lighting device according to claim 8, wherein the wavelength up-conversion material includes a green phosphor and a blue phosphor, the chemical structure formula of the green phosphor is $NaYF_3$:Yb or $LaNbO_4$:Yb, and the chemical structure formula of the blue phosphor is $NaYF_3$:Yb.

10. The lighting device according to claim 9, wherein based on the total weight of the wavelength up-conversion structure being 100 wt %, the concentration of the green phosphor ranges from 2.5 wt % to 30 wt %, and the concentration of the blue phosphor ranges from 2.5 wt % to 30 wt %.

11. The lighting device according to claim 8, wherein the wavelength up-conversion material includes a green phosphor and a blue phosphor, the chemical structure formulas of the green phosphor and the blue phosphor both being $Gd_2O_2S$:Yb, Er.

12. The lighting device according to claim 11, wherein based on the total weight of the wavelength up-conversion structure being 100 wt %, the concentration of the green phosphor ranges from 2.5 wt % to 30 wt %, and the concentration of the blue phosphor ranges from 2.5 wt % to 30 wt %.

13. The lighting device according to claim 1, wherein the first light, before being converted by the wavelength up-conversion structure, has a first chromaticity CIE coordinate, while the first light that remains after the part of the first light is converted by the wavelength up-conversion structure and the second light are mixed to form a third light, and the third light has a second chromaticity CIE coordinate, which is different from the first chromaticity CIE coordinate.

14. The lighting device according to claim 13, wherein the second chromaticity CIE coordinate has a CIE X coordinate ranging from 0.28 to 0.35, and a CIE Y coordinate ranging from 0.21 to 0.65.

* * * * *